ANALOG TO DIGITAL CONVERTER

Filed Aug. 24, 1960 2 Sheets-Sheet 1

INVENTOR.
JAMES J. WOO

BY Carl W. Laumann, Jr.

ATTORNEY

Dec. 10, 1963 JAMES J. WOO 3,114,144

ANALOG TO DIGITAL CONVERTER

Filed Aug. 24, 1960 2 Sheets-Sheet 2

United States Patent Office 3,114,144
Patented Dec. 10, 1963

3,114,144
ANALOG TO DIGITAL CONVERTER

James J. Woo, San Jose, Calif., assignor to International Business Machines Corporation, New York, N.Y., a corporation of New York Filed Aug. 24, 1960, Ser. No. 51,644
18 Claims. (Cl. 340—347)

This invention relates generally to analog to digital converters, and in particular to those converters in which transparent areas of a code mask are sensed by photosensitive cells to provide a digital output indicative of the code mask position.

Such devices find extensive use in positioning systems in which a device is moved to a predetermined digital location corresponding to the desired address. Analog to digital converters of this type represent a compromise between resolving power and output signal on the one hand, and size and complexity on the other.

A common problem in designing a converter of this type arises from the fact that good resolving power and high output are usually obtained only by increasing the size or complexity of the device. It is obvious that good resolving power can be obtained merely by increasing the size of the device and that high output may also be obtained merely by larger mask apertures and correspondingly larger sensing devices or by the addition of amplifiers associated with the sensing devices. The prior art contains many examples of such compromises between these design considerations.

Typical converters have an optical mask in the form of a disk, drum or strip, which contains bands having transparent and opaque areas arranged to represent a code. Each digital position will then have a unique combination of energized and deenergized sensing devices. The mask is positioned between a light source and photosensitive cells so that the output of each cell is determined by the portion of the band which lies between the cell and the light source. By properly dividing the band into opaque and transparent areas a code representing unique combinations of photocell outputs may be provided for each digital position. Commonly, the bands are arranged according to binary order so that one band represents the units order or $2^0$, the second band $2^1$, the third band $2^2$, and the last band $2^{nth}$, the value of $n$ depending on the number of digital positions desired. If such an arrangement is followed, the bands on the mask will have apertures or transparent areas in binary code, thereby providing a unique combination of energized photocells for each digital position. The use of binary code is very desirable, since it provides an output which is compatible to the input of most computers with which a converter is likely to be used.

The difficulty with arrangements employing binary code is the ambiguous output from the photocells as they sense the transition from one digital position to the next. Since the photocell senses an area of definite width it begins to sense the next digital position before it has completely left the previous position. For example, in passing from digital position 3 to position 4, the photocells for the $2^0$ and $2^1$ binary bands will continue to sense the holes for position 3 after the photocell for band $2^2$ has begun to sense the hole in that band for position 4. During the transition from 3 to 4 the photocells may therefore indicate anything from 3 to 7, before the outputs stabilize at 4.

The problem of spurious outputs during transition between digital positions has been solved in various manners by prior art. Most of these are unsatisfactory for one reason or another, for example, a code in which only one cell changes output between position provides a typical solution. Gray codes meet this requirement but have the disadvantage that they are not readily usable in the system to which the converter is attached. A second converter from gray code to binary or decimal code is usually required where this approach is adopted. The additional circuitry required to make the code conversion raises costs and decreases reliability to make such an approach unsatisfactory in many cases.

Another system for eliminating ambiguous signals during transition uses additional photocells with several bands of the mask. Although this provides a more reliable reading, the additional photocells usually require another light source and some form of logical circuitry to provide the necessary digital information. Furthermore, these photocells must be very accurately positioned with respect to each other and to the mask.

Various other prior art systems have proved no more satisfactory than those discussed above.

It is therefore an object of this invention to provide an improved analog to digital converter.

A further object of this invention is to provide an analog to digital converter having an improved means for eliminating ambiguous readings.

Another object of this invention is to provide a small analog to digital converter which has good resolving power and high output.

Still another object of this invention is to provide means for improving the resolving power of an analog to digital converter which also eliminates ambiguous readings during the transition between digital positions.

The foregoing and other objects, features and advantages of the invention will be apparent from the more particular description of a preferred embodiment of the invention, as illustrated in the accompanying drawings.

Figures 1, 2:
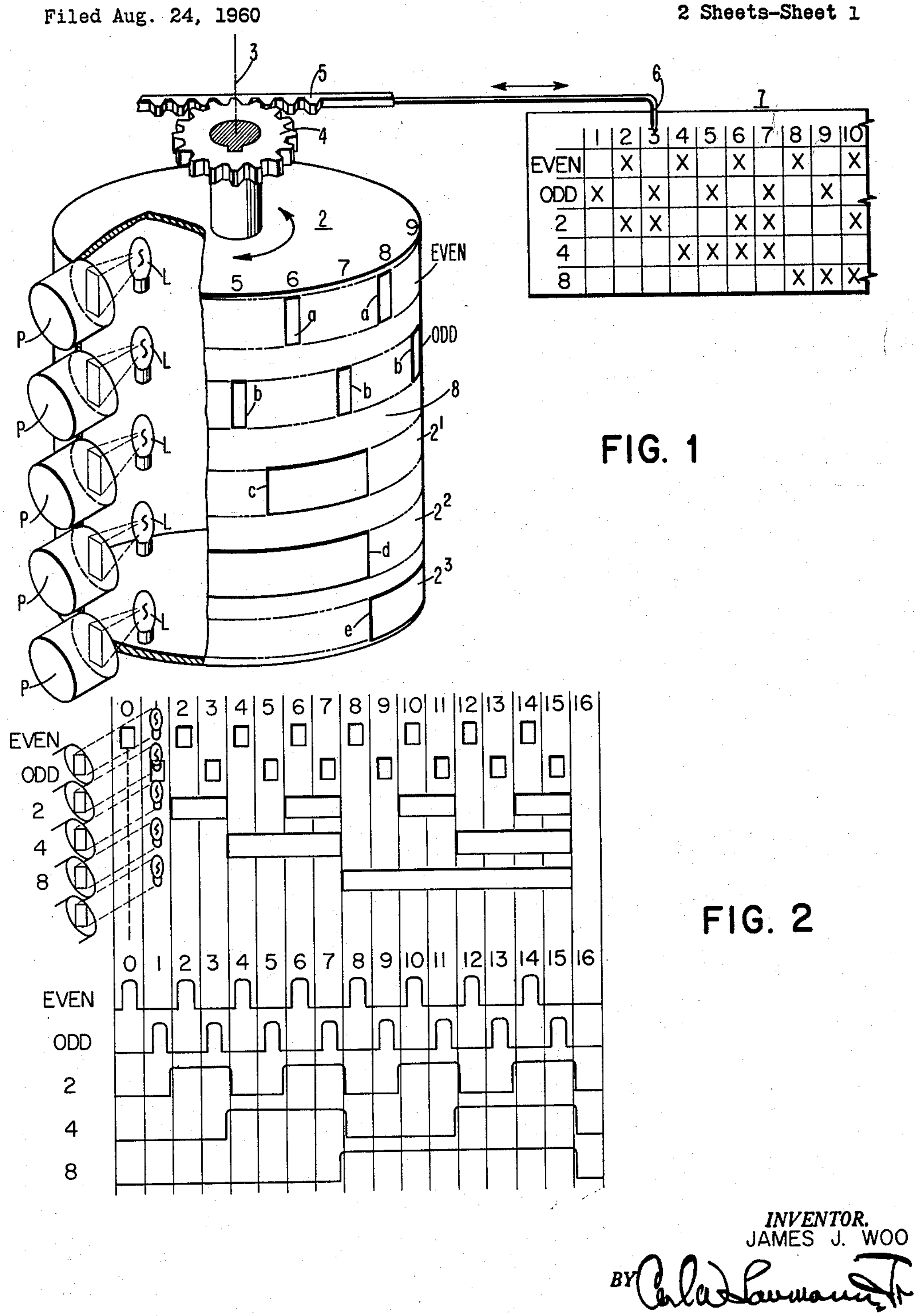
FIG. 1 is a schematic view of a drum-type converter with parts cut away.
FIG. 2 is a view of the mask showing the transparent areas and the corresponding photosensitive cell outputs for various digital positions.

In FIG. 1 a movable drum 2 positionable about an axis of rotation 3 has a gear 4 engaging rack 5 which has a pointer 6 affixed thereto. Pointer 6 indicates the position of drum 2 on the scale 7. Associated with the scale 7 is a chart which indicates with an X those outputs which appear for each digital position. The drum supports a mask 8 containing a plurality of apertures *a*, *b*, *c*, *d* and *e* arranged in bands, which represent Even, Odd, $2^1$, $2^2$ and $2^3$. Associated with each of the aperture band is a light source L and photosensitive cell P arranged so that the apertures contained in the respective bands pass between the cell and light source, producing an output signal from the energized cell. Since the apertures are arranged according to binary code, each digital position of the drum results in a unique combination of energized cells.

The relationship between the output of the photosensitive cell and the position of the drum is better explained with reference to FIG. 2. The digital positions of the drum are shown in decimal form at the top of FIG. 2. In this figure mask 8 has been unrolled and laid flat, so that the linear movement of mask 8 relative to the photosensitive cells P and light sources L corresponds to rotational movement of the drum 2 in FIG. 1. The light sources and light sensing means are shown in the 1 position for this figure. The output of each sensing means for corresponding positions is shown at the bottom of FIG. 2. This shows which of the photosensitive cells are energized as the mask and light sources change their relative position. For example, if the mask is moved to the position shown where the 0 position lies between the sensing means and light sources the Even cell is energized and all other cells are deenergized, and it follows from this combination that the 0 position of the drum is the one being scanned. As the light source and photosensitive cells are moved across the mask, various other combinations of energized and deenergized cells will occur for each digital position.

It will be observed that a difference exists between the nature of the apertures in the Even and Odd bands as compared to the apertures for the higher binary orders. Those apertures in the higher binary orders occupy the full length of each digital position, while those in the Even and Odd bands occupy a portion which is less than the full digital position. This difference is reflected in the nature of the cell outputs. For example, in Even and Odd bands the cells are energized for only a portion of the entire digital position. As can be seen from the bottom half of FIG. 2, the Even cell or Odd cell is energized, but never two at the same time. There is a gap between deenergization of one and energization of the other. The higher binary orders have the aperture for a digital position extending to the very edge of that position. This results in a premature excitation of the sensitive cell associated with that band and a slight delay in deenergization of that cell after the junction between the aperture and the opaque areas of the mask is passed. This lag and premature excitation is well shown in the bottom half of FIG. 2, as a rise in output before the digital position is reached and a delay in deenergization after the digital position is passed.

Since it is necessary to have one or the other of the Even and Odd sensing cells energized in order to represent a digital position, as will be explained later, there can never be an ambiguous output from the photosensitive cell. This is fairly obvious since the Even or Odd cells for the next position are energized only after the higher binary order cells for the previous position have decayed to the 0 level and are deenergized before the premature rise of the higher binary order cells for the next position has occurred. This may result in a condition where no digital position is indicated, but this is insignificant in exchange for the tremendous advantage of elimination of all spurious outputs. Since it is the center of all digital positions which is desired, there is an advantage in eliminating any output which occurs at the extreme end of the digital position.

From FIG. 2 is can be seen that the mask is very easily produced. There are no thin sections separating adjacent apertures, such as would commonly be found in a high resolution converter of this type. Furthermore, the use of an aperture having a space equal to the full digital position for higher binary orders allows the cell associated with those apertures to provide a much higher output than would normally be the case. Additionally, since the Even and Odd binary sensing cells are the ones which actually determine the resolution power of the device, the higher binary order tracks need not be made with any great degree of accuracy. It is only necessary that the higher binary orders be energized after the Even or Odd cell has decayed and deenergized before the rise of the signal from the Even or Odd cell of the next digital position.

Figure 3:
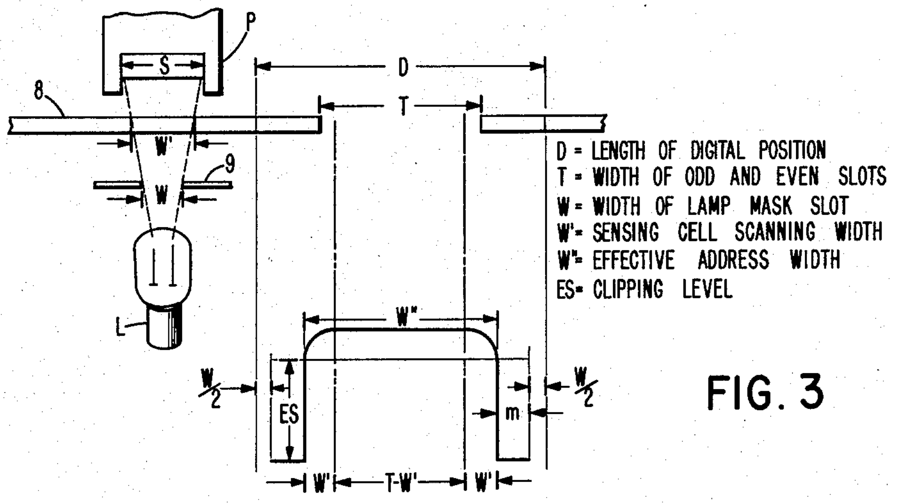
FIG. 3 is a cross-section through the mask and photocell showing the relative positions of the light source, mask and photosensitive cell, together with a representation of the photosensitive cell output for the various mask positions.

The precise dimensions of the Even and Odd apertures relative to the digital positions, the light source and sensing means are shown in FIG. 3. The light source L is located a short distance away from a collimating mask 9 having a slit width dimension W. The collimated beam from lamp L has a width W′ at the outer surface of the mask 8. The beam has a further dimension equal to the width S of the sensing cell P when it reaches the cell. Thus the sensing cell P effectively scans a width W′ at the mask. Apertures in the Even and Odd track have a width T which is less than the width of the digital position. Since the cell P will begin to have an output as soon as the scanned width W′ includes a portion of the aperture T, an output will be produced for the length of scan $T+W'$. However, the output of the sensing cell 8 does not rise immediately to the full level, since initially only a portion thereof is energized. The effective or usable output of the cell occurs over a length W″, the linear address width, which will be something less than the length $T+W'$. This length W″ is determined by the signal to noise ratio amplifiers associated with the Even and Odd sensing devices and the minimum level which is required to activate the circuits associated with these cells. The usable output is the portion which exceeds the clipping level $E_S$. The length W″ representing the distance for which the output of the cell exceeds this value.

The digital position in FIG. 3 occupies a length D. Since the output from the higher binary order sensing devices may extend a distance $$\frac{W'}{2}$$

beyond the previous digital position, and may occur $$\frac{W'}{2}$$

before the next digital position, it is necessary to have the distance $D>T+W'+W'+2m$, where $m$ represents the gap between the deenergization of the cells associated with the Even and Odd band, and the premature energization of the cells associated with the higher binary orders. If all tracks are made with equal accuracy, $m$ can be made quite small; however, in many cases it will be desirable to make only the Even and Odd tracks with high accuracy and permit a somewhat greater latitude or tolerance with respect to the higher binary orders. In such a case, the spacing $m$ must be made somewhat greater to provide the required safety factor.

Figure 4:
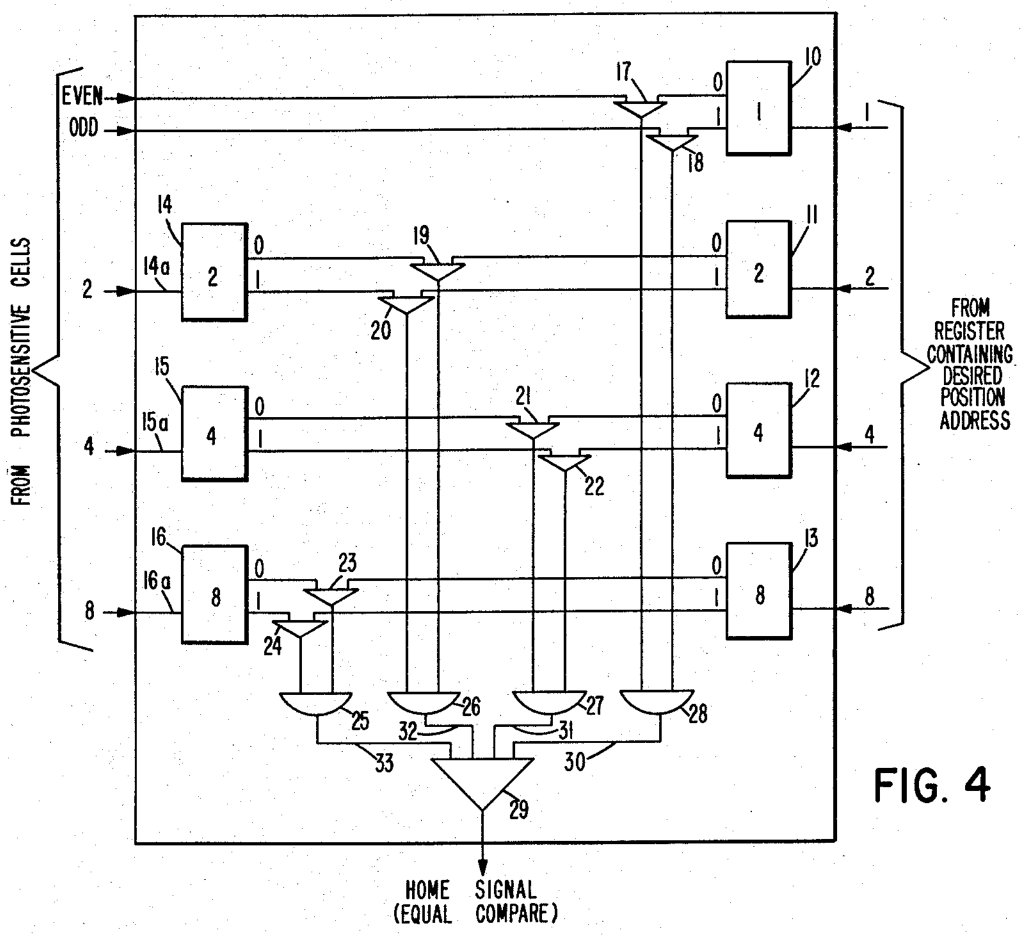
FIG. 4 is a schematic diagram of the circuit which compares the photosensitive cell output with the address of the desired position.

FIG. 4 shows circuitry usable with the photocells and any conventional register to provide a signal indicative of a home position. Where it is desired to position the drum to a predetermined digital location, the binary equivalent of the location is placed in a register, which may be any well known type. Such a register would present a voltage on the appropriate lines **10*a*, 11*a*, 12*a* and 13*a* feeding triggers 10, 11, 12 and 13. These voltages would condition the triggers 10, 11, 12 and 13 to present appropriate output voltages at terminals 0 and 1 to represent those input terminals energized from the register. The outputs from sensing cells 2, 4 and 8 are triggers applied to the inputs 14*a*, 15*a* and 16*a* of triggers 14, 15 and 16. Output terminals 0 and 1 of triggers 14, 15 and 16** have voltages dependent on those of the sensing cells which are energized. Since the triggers are used only for the purpose of deriving the two voltage levels necessary for this type of equal compare circuit, it is recognized that no such trigger is required for the Even and Odd position, since the two voltages already exist. The comparison of the units binary order may therefore be made directly.

AND circuit 17 together with AND circuit 18 provide outputs when the desired address and the digital position of the mask are both 0 or 1, respectively. Comparison of the $2^1$ binary order is made with AND circuits 19 and 20 providing outputs when the desired address and the digital position of the mask are both 0 or 1, respectively, for this order. Comparison between the $2^2$ binary order is made in AND circuits 21 and 22 which have outputs when the desired address and the position of the mask are both 0 or 1, respectively for this order. AND circuits 23 and 24 provide a similar comparison function for the $2^3$ binary order. AND circuit 23 provides an output when the desired address and the digital position of the mask are both 0 in the $2^3$ binary order. AND circuit 24 provides an output when the desired address and the digital position of the mask are both 1 in the $2^3$ binary order. AND circuits 17 through 24, inclusive, energize OR circuits 25, 26, 27, and 28. Each OR circuit is associated with one binary order so that one or the other of the AND circuits 17, 18; 19, 20; 21, 22 and 23, 24 must be energized in order to provide at a signal input to each of OR circuits 25–28. Since the outputs of the OR circuits 25–28 are fed to AND circuit 29, OR circuits 25, 26, 27 and 28 must each provide an output to AND circuit 29 in order to develop a home or equal compare signal. The home signal will therefore be produced only when the outputs from the photosensitive cells correspond exactly to the outputs of the register containing the desired position addressed.

As mentioned earlier, there are times when both the Even and Odd cells will be deenergized. Since one or the other of AND circuits 17 and 18 must be energized to provide one of the inputs to AND circuit 29 it is obvious that the home signal can be produced only when one of the Even or Odd cells is energized and the other inputs to AND circuit 29 are also present.

In summary, AND circuit 29 has an input 30 which is energized when there is an identity in the units order, an input 31 which is energized when there is an identity in the 2′ order, an input 32 which is energized when there is an identity in the $2^2$ order and an input 33 which is energized when there is an identity in the $2^3$ order. The home signal can be produced only when a complete identity exists between the mask position and the desired address in the register. This signal may be used to stop an actuating device moving the drum to begin or stop an operation to be performed on other portions of the movable drum. Other applications of this signal will be obvious to one skilled in the art.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. In an analog to digital converter: a movable mask having bands with transparent and opaque areas and positionable in accordance with an analog function, a single light sensing means and light source associated with each of said bands, first and second of said bands representing Even and Odd digital positions corresponding to the smallest digital division, additional of said bands representing higher binary orders, successive transparent areas in said first and second bands spaced to provide alternate and mutually exclusive outputs from the light sensing means associated therewith.

2. In an analog to digital converter: a mask having bands with transparent and opaque areas and positionable in accordance with an analog function, a single light sensing means and light source associated with each of said bands, first and second of said bands having alternate transparent areas representing successive positions corresponding to the smallest digital division, additional of said bands representing higher binary orders, said successive transparent areas in said first and second bands being spaced a distance whereby alternate and mutually exclusive outputs are provided by said sensing means associated therewith.

3. In an analog to digital converter: a movable mask having bands with transparent and opaque areas, a single light sensing means and light source associated with each of said bands, first and second of said bands representing Even and Odd digital positions corresponding to the smallest digital division, additional of said bands representing higher binary orders, successive transparent areas in said first and second bands being spaced a distance whereby alternate and mutually exclusive outputs are provided by said sensing means associated therewith to eliminate ambiguity at digital boundaries.

4. In an analog to digital converter: a movable mask having bands with transparent and opaque areas, means for positioning said mask in accordance with an analog function, a single light sensing means and light source associated with each of said bands, first and second of said bands having alternate transparent areas representing successive positions corresponding to the smallest digital division, additional of said bands representing higher binary orders, said alternate transparent areas in said first and second bands being spaced a distance whereby alternate and mutually exclusive outputs are provided by said sensing means associated therewith to eliminate ambiguity at digital boundaries.

5. In an analog to digital converter: a movable mask having bands with transparent and opaque areas, means for positioning said mask in accordance with an analog function, a single light sensing means and light source associated with each of said bands, first and second of said bands representing Even and Odd digital positions corresponding to the smallest digital division, additional of said bands representing higher binary orders, successive transparent areas in said first and second bands being spaced a distance whereby alternate and mutually exclusive outputs are provided by said sensing means associated therewith to eliminate ambiguity at digital boundaries, said additional bands having transparent and opaque areas accordingly to binary code, said transparent areas for the additional bands occupying the full space for each digital position.

6. In an analog to digital converter: a movable mask having bands with transparent and opaque areas, a single light sensing means and light source associated with each of said bands, first and second of said bands having successive alternate transparent areas representing successive positions corresponding to the smallest digital division, additional of said bands representing higher binary orders, successive transparent areas in said first and second bands being spaced a distance whereby alternate and mutually exclusive outputs are provided by said sensing means associated therewith to eliminate ambiguity at digital boundaries, said additional bands having transparent and opaque areas according to binary code, said transparent areas for the additional bands occupying the full space for each digital position whereby opaque boundaries are eliminated between adjacent transparent areas in the same band for successive digital positions.

7. In an analog to digital converter: a mask having a plurality of bands with transparent and opaque areas arranged according to binary code, a light sensing device and a light source for each of said bands, said mask being movable relative to said sensing devices, first and second of said bands alternately representing the smallest incremental digital positions of a length D, said first and second bands having alternate transparent areas of a width T along the direction of movement centered in each digital position, said light sensing device positioned to scan a length W′ whereby said transparent areas and associated light source coact to provide alternate and mutually exclusive outputs at said first and second band sensing devices for a length of movement $T+W'$ where $D>T+W'$.

8. In an analog to digital converter: a mask having a plurality of bands with transparent and opaque areas arranged according to binary code, a light sensing device and a light source for each of said bands, said mask being movable relative to said sensing devices, first and second of said bands representing respectively alternate smallest incremental digital positions of a length D, said first and second bands having alternate transparent areas of a width T along the direction of movement centered in each digital position, said light sensing device positioned to scan a length W' whereby said transparent areas and associated light source coact to provide alternate and mutually exclusive outputs at said first and second band sensing devices for a length of movement $T+W'$ where $D>T+W'$, other of said bands having transparent areas wider than T for each digital position.

9. In an analog to digital converter: a mask having a plurality of bands with transparent and opaque areas arranged according to binary code, a light sensing device and a light source for each of said bands, said mask being movable relative to said sensing devices, first and second of said bands representing respectively alternate smallest incremental digital positions of a length D, said first and second bands having alternate transparent areas of a width T along the direction of movement centered in each digital position, said light sensing device positioned to scan a length W' whereby said transparent areas and associated light source coact to provide alternate and mutually exclusive outputs at said first and second band sensing devices for a length of movement $T+W'$ where $D>T+W'$, other of said bands having transparent areas of length D for each digital position.

10. In an analog to digital converter: a mask having a plurality of bands with transparent and opaque areas arranged according to binary code, a light sensing device and a light source for each of said bands, said mask being movable relative to said sensing devices, first and second of said bands representing respectively alternate smallest incremental digital positions of a length D, said first and second bands having alternate transparent areas in each digital position, said light sensing device positioned to scan a length W', opaque areas having a width greater than $D+2W'$ between transparent areas in each of said first and second bands, said transparent areas and associated light source coact to provide alternate and mutually exclusive outputs at said first and second band sensing devices for a length of movement $T+W'$ where $D>T+W'$.

11. In an analog to digital converter: a mask having a plurality of bands with transparent and opaque areas arranged according to binary code, a light sensing device and a light source for each of said bands, said mask being movable relative to said sensing devices, first and second of said bands representing respectively alternate smallest incremental digital positions of a length D, said first and second bands having alternate transparent areas in each digital position, said light sensing device positioned to scan a length W', opaque areas having a width greater than $D+2W'$ between transparent areas in each of said first and second bands whereby said transparent areas and associated light source coact to provide alternate and mutually exclusive outputs at said first and second band sensing devices for a length of movement $T+W'$ where $D>T+W'$, other of said bands having transparent areas of length D for each digital position.

12. In an analog to digital converter: a mask having a plurality of bands with transparent and opaque areas arranged according to binary code, a light sensing device and a light source for each of said bands, said mask being movable relative to said sensing devices, first and second of said bands representing respectively alternate smallest incremental digital positions of a length D, said first and second bands having alternate transparent areas in each digital position, said light sensing device positioned to scan a length W', opaque areas having a width greater than $D+2W'$ between transparent areas in each of said first and second bands whereby said transparent areas and associated light source coact to provide alternate and mutually exclusive outputs at said first and second band sensing devices for a length of movement $T+W'$ where $D>T+W'$, other of said bands having no opaque area between consecutive transparent areas.

13. In an analog to digital converter: a mask having a plurality of bands with transparent and opaque areas arranged according to binary code, a light sensing device and a light source for each of said bands, said mask being movable relative to said sensing devices, first and second of said bands representing respectively alternate smallest incremental digital positions of a length D, said first and second bands having alternate transparent areas in each digital position, said light sensing device positioned to scan a length W', opaque areas having a width greater than $D+2W'$ between transparent areas in each of said first and second bands whereby said transparent areas and associated light source coact to provide alternate and mutually exclusive outputs at said first and second band sensing devices for a length of movement $T+W'$ where $D>T+W'$, other of said bands having contiguous transparent areas for successive digital positions.

14. A position indicating device comprising: a positionable mask having bands with transparent and opaque areas, a single light sensing means and light source associated with each band, first and second of said bands having transparent areas representing Even and Odd digital positions corresponding to binary 1 and $\bar{1}$, respectively, the smallest digital division, additional of said bands representing higher binary orders whereby the output of said light sensing means provides a direct binary representation of said mask position, a register for storing a binary number representing a position of said mask, comparison means energized by the output of said sensing means and said register, said comparison means providing an indication when the position of said mask corresponds to the binary number in said register.

15. A position indicating device comprising: a positionable mask having bands with transparent and opaque areas, a single light sensing means and light source associated with each band, first and second of said bands having transparent areas representing Even and Odd digital positions corresponding to binary 1 and $\bar{1}$, respectively, the smallest digital division, additional of said bands representing digital positions corresponding to higher binary orders whereby the output of said light sensing means provides a direct binary representation of said mask position, a register for storing a binary number representing a position of said mask, comparison means energized by the output of said sensing means and said register, said comparison means providing an indication when the position of said mask corresponds to the binary number in said register.

16. A position indicating device comprising: a positionable mask having bands with transparent and opaque areas, a single light sensing means and light source associated with each band, the transparent areas of said first and second bands representing Even and Odd digital positions corresponding to binary 1 and $\bar{1}$, respectively, the smallest digital division, additional of said bands representing digital positions corresponding to higher binary orders whereby the output of said light sensing means provides a direct binary representation of said mask position, a register for storing a binary number representing a position of said mask, comparison means energized by the output of said sensing means and said register, said comparison means providing an indication of equality upon energization of said Even or Odd light sensing means when the digital position of said mask corresponds to the binary number in said register.

17. A position indicating device comprising: a positionable mask having bands with transparent and opaque areas, a single light sensing means and light source associated with each band, said sensing means and said source disposed on opposite sides of said mask in position to provide an output from said sensing means when said transparent area lies therebetween, the transparent areas of said first and second bands representing Even and Odd digital positions corresponding to binary 1 and $\bar{1}$, respectively, the smallest digital division, additional of said bands representing digital positions corresponding to higher binary orders whereby the output of said light sensing means provides a direct binary representation of said mask position, a register for storing a binary number representing a position of said mask, comparison means energized by the output of said sensing means and said register, said comparison means providing an indication when the position of said mask corresponds to the binary number in said register.

18. A position indicating device comprising: a positionable mask having bands with transparent and opaque areas, a single light sensing means and light source associated with each band, said sensing means and said source disposed on opposite sides of said mask in position to provide an output from said sensing means when said transparent area lies therebetween, the transparent areas of said first and second bands representing Even and Odd digital positions corresponding to binary 1 and $\bar{1}$, respectively, the smallest digital division, additional of said bands representing digital positions corresponding to higher binary orders, whereby the output of said light sensing means provides a direct binary representation of said mask position, a register for storing a binary number representing a position of said mask, comparison means energized by the output of said sensing means and said register, said comparison means providing an indication of equality upon energization of said Even or Odd light sensing means when the digital position of said mask corresponds to the binary number of said register.

References Cited in the file of this patent

UNITED STATES PATENTS 2,938,199 Berman ---------------- May 24, 1960

OTHER REFERENCES

IBM Technical Disclosure Bulletin, Opto-Electron-mechanical Digital Positions Comparator, by F. A. Litz, vol. 1, No. 1, June 1958, pp. 27 and 28.